(12) United States Patent
Kurihara et al.

(10) Patent No.: US 6,373,742 B1
(45) Date of Patent: Apr. 16, 2002

(54) TWO SIDE DECODING OF A MEMORY ARRAY

(75) Inventors: Kazuhiro Kurihara, Sunnyvale; Shane C. Hollmer, San Jose; Pau-Ling Chen, Saratoga, all of CA (US)

(73) Assignees: Advanced Micro Device, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/689,036

(22) Filed: Oct. 12, 2000

(51) Int. Cl.[7] .................................................. G11C 5/06
(52) U.S. Cl. ...................... 365/63; 365/51; 365/230.06; 365/189.08
(58) Field of Search ..................... 365/63, 51, 230.06, 365/189.08, 189.09, 230.03

(56) References Cited

U.S. PATENT DOCUMENTS

| | | | |
|---|---|---|---|
| 5,896,344 A | * | 4/1999 | Kirsch et al. ............ 365/230.06 |
| 5,940,315 A | * | 8/1999 | Cowles ........................ 365/51 |
| 6,212,090 B1 | * | 4/2001 | Akita et al. .................... 365/63 |

FOREIGN PATENT DOCUMENTS

JP    362192094 A  *  8/1987  ............ G11C/17/00

* cited by examiner

*Primary Examiner*—David Nelms
*Assistant Examiner*—David Lam

(57) ABSTRACT

A decoder for decoding from two sides of a memory array. The decoder is positioned on two sides of the memory array. The decoder includes driver circuits that are connected to routing lines from the memory array. To reduce the size of the decoder, some of the routing lines extend from one side of the memory array and the remaining routing lines extend from the other side of the memory array.

16 Claims, 6 Drawing Sheets

| | HEIGHT (54) | ROOM FOR ROUTING LINE (56) | i-tr (58) | n-tr (60) | p-tr (62) | TOTAL WIDTH (64) |
|---|---|---|---|---|---|---|
| ONE SIDE | 4.7um×4 =18.8um | 58um | (3+1.1)×16 =65.6um | (3+1.1)×16 =65.6um | (7+1.1)×16 =129.6um | 260.8um |
| TWO SIDE | 4.7um×8 =37.6um | 39.2um | (3+1.1)×8 =32.8um | (3+1.1)×8 =32.8um | (7+1.1)×8 =64.8um | 130.4um |
| DIFFERENCE | | | | | | 130.4um |

(66)

TWO SIDE DECODING OF A MEMORY ARRAY

FIELD OF THE INVENTION

The present invention relates generally to memory devices and, more particularly, to decoding a memory array from two sides.

BACKGROUND

One type of memory device which has found wide commercial success in the electronics industry is commonly referred to as flash memory. This commercial success is due in part to the ability of flash memory devices to store electronic data over long periods of time without an electric power supply. In addition, flash memory devices can be erased and programmed by the end user after they are installed in an electronic device. This combined functionality is especially useful in electronic device applications, such as cellular telephones, personal digital assistants, and computer BIOS storage and other applications where power supply is intermittent and programmability is desired.

Flash memory devices are made up of an array of individual memory transistors, or cells, which are similar to those used in other types of memory devices. Flash memory devices, however, typically achieve their non-volatility of the memory cells by the addition of a floating gate between the control gate and the substrate region of the transistors. Like other memory devices, the transistors are oriented in rows and columns to form an array of transistors. As is common in the memory device art, the control gates of the memory cells in each row of the array are connected to a series of word lines, thus forming individual rows of cells that can be accessed by selecting the corresponding word line. Similarly, the drain regions of the cells in each column of the array are connected to a series of bit lines, thus forming individual columns of cells that can be accessed by selecting the corresponding bit lines. Finally, the source regions of each of the cells in the array are connected to a common source line. In some flash memory devices the array of transistors is subdivided into sectors of separate transistor arrays to provide added flexibility to the programming and erasing operations.

The data stored in each memory cell represents a binary 1 or 0, as is well-known in the art. To perform a program, read, or erase operation on a particular cell in the array, various predetermined voltages are applied to the control gate, drain region, and source region of the memory cell. By applying these predetermined voltages to a particular bit line column, a particular word line row, and the common source line, an individual cell at the intersection of the bit line and word line can be selected for reading or programming.

To program a cell, the control gate and the drain region of the cell are raised to predetermined programming voltages and the source is grounded. The voltages on the control gate and the drain region cause the generation of hot electrons which are injected onto the floating gate where they become trapped, forming a negative charge on the floating gate. This electron transfer mechanism is often referred to as Channel Hot Electron (CHE) injection. When the programming voltages are removed, the negative charge on the floating gate is maintained, thereby raising the threshold voltage. The threshold voltage is used during reading operations to determine if the cell is in a charged state, that is programmed, or whether the cell is in an uncharged state, that is un-programmed.

Cells are read by applying a predetermined voltage to the control gate and the drain region and grounding the source of the cell. The current in the bit line is then sensed with a sense amplifier. If the cell is programmed, the threshold voltage will be relatively high and the bitline current will be zero or at least relatively low, thus registering a binary 0. On the other hand if the cell is erased, the threshold voltage will be relatively low and the bit line current will be relatively high, thus registering a binary 1.

In contrast to the programming procedure, flash memory devices are typically bulk-erased by simultaneously erasing all the cells in a memory sector. One procedure for erasing an entire memory sector involves applying predetermined voltages to the common source line and all the word lines of the sector while the drain regions of the cells are left to float. This causes electron tunneling from the floating gate to the source region through Fowler-Nordheim (F-N) tunneling, which removes the negative charge from the floating gate of each of the cells in the memory sector.

Typically, the memory device is provided with a number of address pins that allow the user to specify individual groups of memory cells for various operations. As is well-known in the art, the number of address pins usually provided for selecting the rows of cells is equal to $2^x$, where x is the number of word lines in the memory device. Similarly, the number of address pins usually provided for selecting column groups of cells is equal to $2^y$, where y is the number of bytes or words in each row of cells (a byte being eight cells and a word being sixteen cells). When the memory device is performing internal embedded functions, the address bits for the row and column bits will sometimes be generated by a state machine within the memory device instead of being provided by the user through the address pins. The memory device also provides a number of data pins for input and output of the memory cell data. In a simple memory device, the number of data pins is equal to the number of column groups of cells that are selected by the column address bits.

In order to translate the row and column address bits into the specific word lines and bit lines that must be selected for an operation, an X-decoder and a Y-decoder are usually provided in the memory device. As is well-known in the art, the X-decoder receives the row address bits and connects the particular word line that corresponds to the address signal to the appropriate circuits. For example, in the case of a reading operation, the X-decoder will connect the selected word line to a voltage boosting circuit. Likewise, the Y-decoder receives the column address bits and connects the particular bit lines that correspond to the address signal to the appropriate circuits. In reading operations, the Y-decoder will connect each of the selected bit lines to a sense amplifier.

As is well-known in the memory device art, manufacturers of memory devices prefer circuit designs that are small and compact. One reason for this desire is the high fixed expense associated with manufacturing memory devices. By designing memory devices that are smaller, manufacturers can manufacture more memory devices with the same equipment, thus lowering the average cost of the memory devices. On the other hand, compact circuit designs also allow more circuits to be placed on a memory device without increasing the size of the memory device, thus improving the performance of the memory device without increasing the cost of the memory device. Accordingly, manufacturers desire circuit designs that optimize the layout of the circuits in the memory device by minimizing the space required by the circuits.

SUMMARY

A decoder is provided for decoding address bits from two sides of a memory array. In one embodiment, routing lines for the word lines of the memory array alternately extend from the left side and the right side of the array. Driver circuits that are connected to each of the word lines are positioned on both sides of the memory array. Because the vertical space required for the routing lines that are connected to the driver circuits is reduced, the width of the decoder can be reduced by providing additional rows of driver circuits with fewer driver circuits in each row.

DETAILED DESCRIPTION OF THE INVENTION

Figure 1:
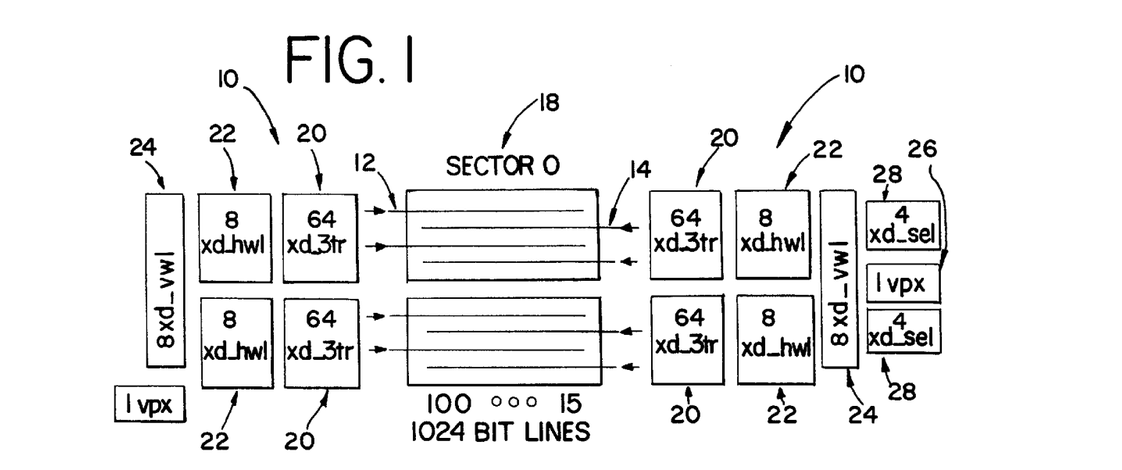
FIG. 1 is a block diagram of a memory array and an X-decoder.
Figures 3, 4:
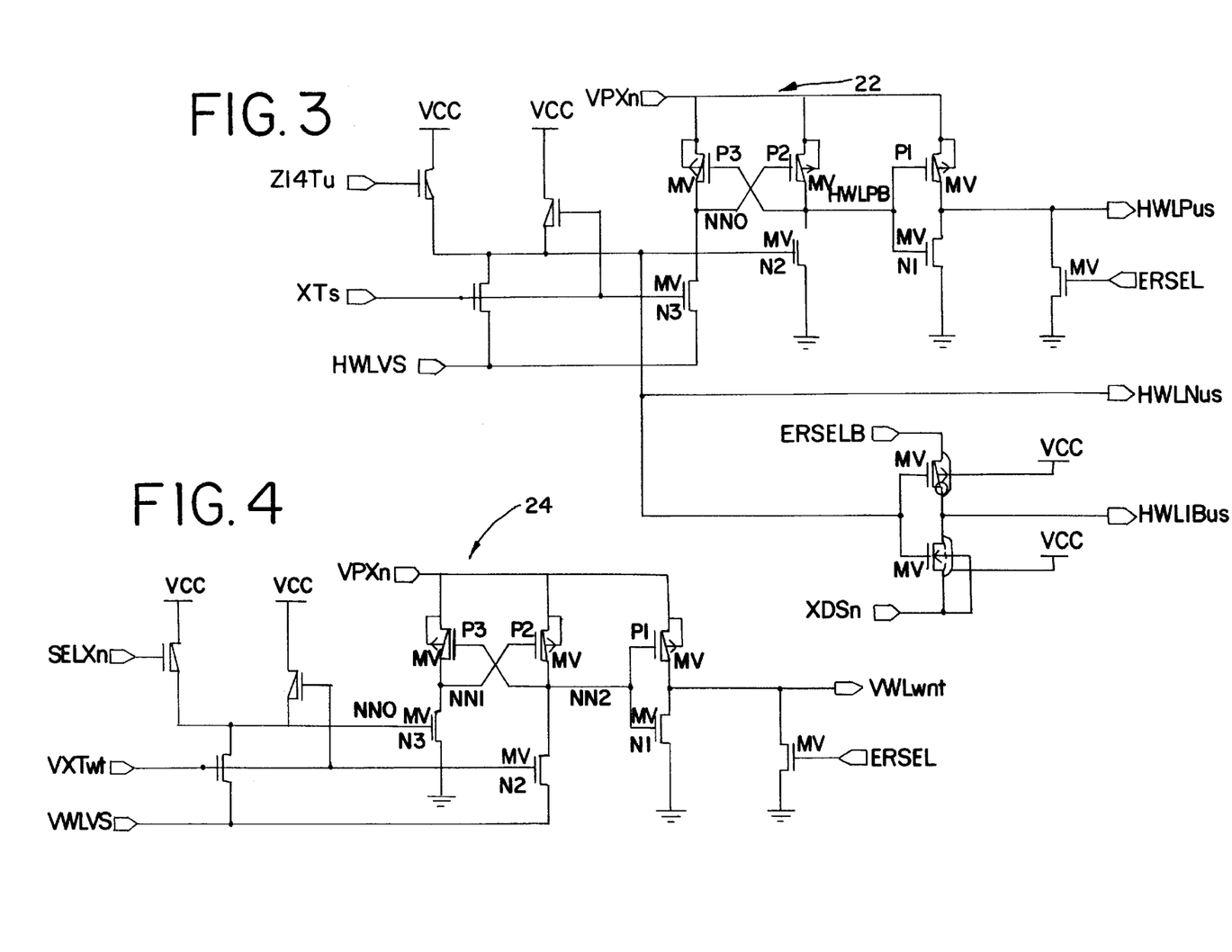
FIG. 3 is a circuit diagram of a xd_hwl circuit.
FIG. 4 is a circuit diagram of a xd_vwl circuit.

Referring now to the drawings, and particularly to FIG. 1, an X-decoder is provided for decoding the word lines 12,14 of a memory array 18 from two sides of the memory array 18. In one embodiment, the memory array 18 is a sector of memory cells with 1024 bit lines 16 and 256 word lines 12,14. Although other circuits are possible for an X-decoder 10, the embodiment shown includes 256 xd_3tr circuits 20, 32 xd_hwl circuits 22, 16 xd_vwl circuits 24, 2 vpx circuits 26, and 8 xd_sel circuits 28. The xd_3tr circuits 20 serve as the output stage of the X-decoder 10 and drive the voltage of the word lines 12,14 when a particular word line 12,14 is selected by the address bits. Therefore, an equal number of xd_3tr circuits 20 are provided to the number of word lines 12,14 so that each word line 12,14 is connected to a separate xd_3tr circuit 20. The xd_hwl 22 and xd_vwl 24 circuits provide decoding signals to the xd_3tr circuits 20, with the xd_hwl circuits 22 being routed horizontally to the xd_3tr circuits 20 and the xd_vwl 24 circuits being routed vertically to the xd_3tr circuits 20. Circuit diagrams of the xd-hwl 22 and xd_vwl 24 circuits are shown in FIGS. 3 and 4, respectively; and their operation Will be apparent to those skilled in the art. The xd_sel circuits 28 are sector selection circuits that select the proper sector based on the address bits. Lastly, the vpx circuits 26 are power supplies that provide the necessary voltage for the word lines 12,14

As further shown in FIG. 1, the X-decoder circuits 10 are positioned on two sides of the memory array 18. Accordingly, 128 xd_3tr circuits 20,16 xd_hwl circuits 22, 8 xd_vwl circuits 24, and 1 vpx circuit 26 are positioned on each side of the memory array 18. The 8 xd_sel circuits 28 are positioned on only one side of the memory array 18. As explained above, each of the word lines 12,14 are connected to one xd_3tr circuit 20. Thus, with the two side decoding X-decoder 10, half of the routing lines 13 for the word lines 12 extend from the left side of the memory array 18 to connect to the 128 xd_3tr circuits 20 on the left side. Likewise, the other half of the routing lines 15 for the word lines 14 extend from the right side of the memory array 18 to connect to the 128 xd_3tr circuits 20 on the right side. Preferably, the xd_3tr circuits 20 on each side of the memory array 18 are connected to alternating word lines 12,14 so that every other word line 12 connects to a xd_3tr circuit 20 on the left side and the remaining word lines 14 are connected to xd_3tr circuits 20 on the right side.

Figure 2:
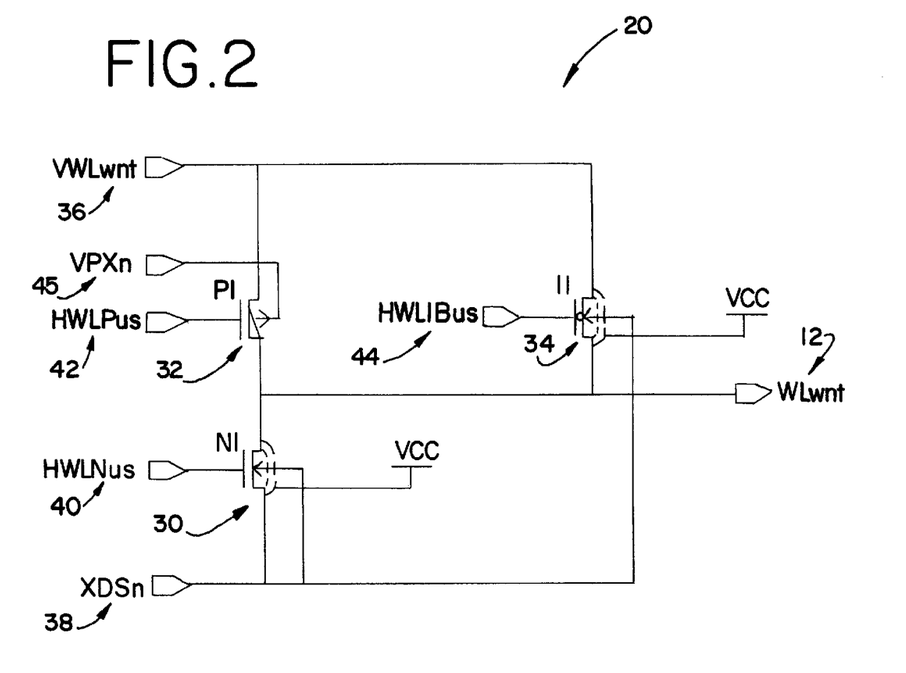
FIG. 2 is a circuit diagram of a xd_3tr circuit.

Turning now to FIG. 2, each of the xd_3tr circuits 20 include three transistors—an n-channel transistor 30, a p-channel transistor 32, and an i-transistor 34. As is well known in the art, an n-channel transistor is switched on to pass current through the transistor when a binary 1 is applied to the gate of the transistor. Similarly, a p-channel transistor is switched on to pass current when a binary 0 is applied to the gate. An i-transistor is an intrinsic transistor, which is a modified n-channel transistor with a lower threshold voltage. The detailed operating principles, however, of the xd_3tr circuit 20 are not important to the present invention and require only a brief description, since those skilled in the art will readily appreciate the operating principles of the circuit. The source region of both the p-channel transistor 32 and the i-channel transistor 34 are connected to the signal VWLwnt 36, while the source region of the n-channel transistor 30 is connected to the signal XDSn 38. The gates of the transistors are connected, respectively, to the signals HWLNus 40, HWLPus 42, and HWLIBus 44 for the n-channel transistor 30, p-channel transistor 32, and i-transistor 34. The vpx circuit 26 supplies the signal VPXn 45 to the p-channel transistor 32. The drain regions of all three transistors are connected to a single word line 12,14.

Figure 5:
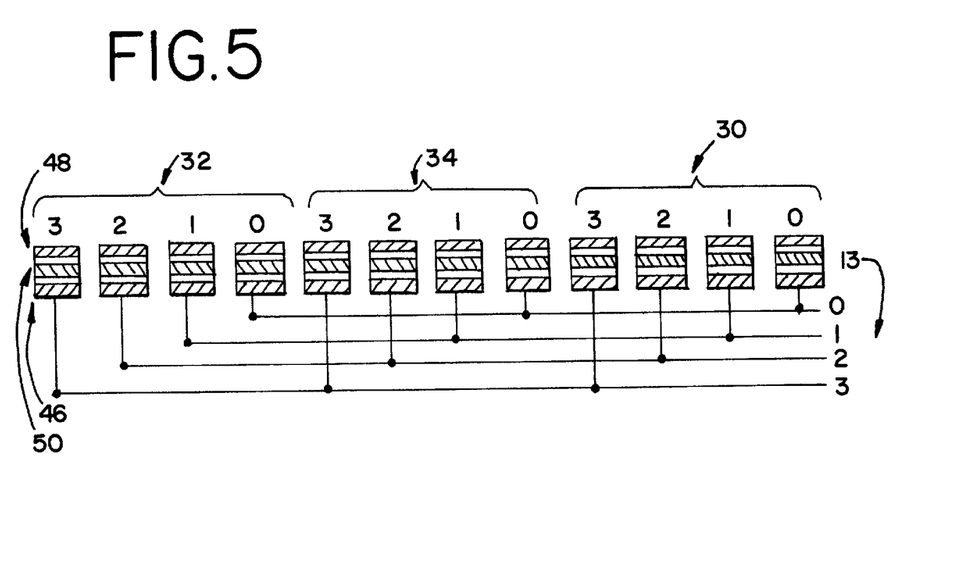
FIG. 5 is a diagram of four xd_3tr circuits connected to four routing lines.

Turning now to FIG. 5, an arrangement for connecting groups of n-channel transistors 30, p-channel transistors 32, and i-transistors 34 to the word lines 12,14 is shown. In this arrangement, four xd_3tr circuits 20 are represented, with the transistors 30, 32, 34 labeled 0 forming one xd_3tr circuit 20, the transistors 30, 32, 34 labeled 1 forming another xd_3tr circuit 20, and so forth. The transistors 30, 32, 34 are arranged so that all of the n-channel transistors 30 are grouped together, all of the p-channel transistors 32 are grouped together, and all of the i-transistors 34 are grouped together. Other arrangements, however, are also possible. As explained, above, each of the three transistors 30, 32, 34 in a single xd_3tr circuit 20 are connected to the same word line 12,14. Accordingly, the drain regions 46 of each of the transistors 30, 32, 34 labeled 0 are connected to the routing line 13,15 for the word line 12,14 labeled 0; the drain regions 46 of the transistors 30, 32, 34 labeled 1 are connected to the routing line 13,15 for the word line 12,14 labeled 1; and so forth. The source regions 48 and the gates 50 of the transistors 30, 32, 34 are connected to the signals 36, 38, 40, 42, 44 as previously described.

Figure 6:
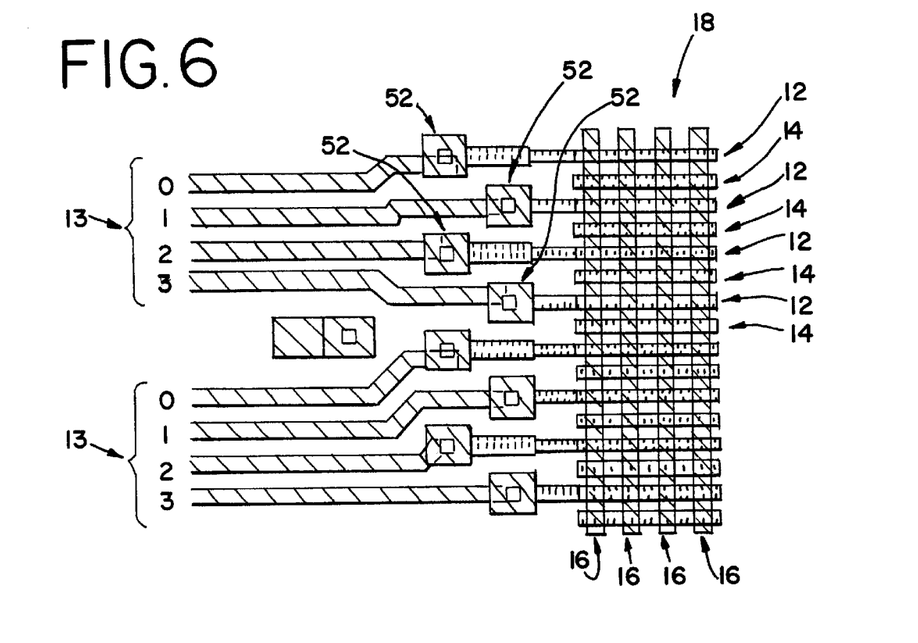
FIG. 6 is a diagram of a memory array, showing routing lines connected to word lines.

Turning now to FIG. 6, the connection of the routing lines 13,15 to the word lines 12,14 is shown. Typically, the routing lines 12,14 metal 1 lines, while the word lines 12,14 are poly 2 lines. Therefore, contacts 52 are provided to connect the corresponding routing lines 13,15 to the appropriate word lines 12,14. As is common in the art, the word lines 12,14 extend horizontally across the memory array 18. As previously described, every other word line 12 is connected to a routing line 13 that extends from the left side of the memory array 18 to connect to xd_3tr circuits 20 on the left side, while the remaining word lines 14 are connected to routing lines 15 that extend from the right side to connect to xd_3tr circuits 20 on the right side. As is common in the art, the bit lines 16 extend vertically across the memory array 18.

Figure 7:
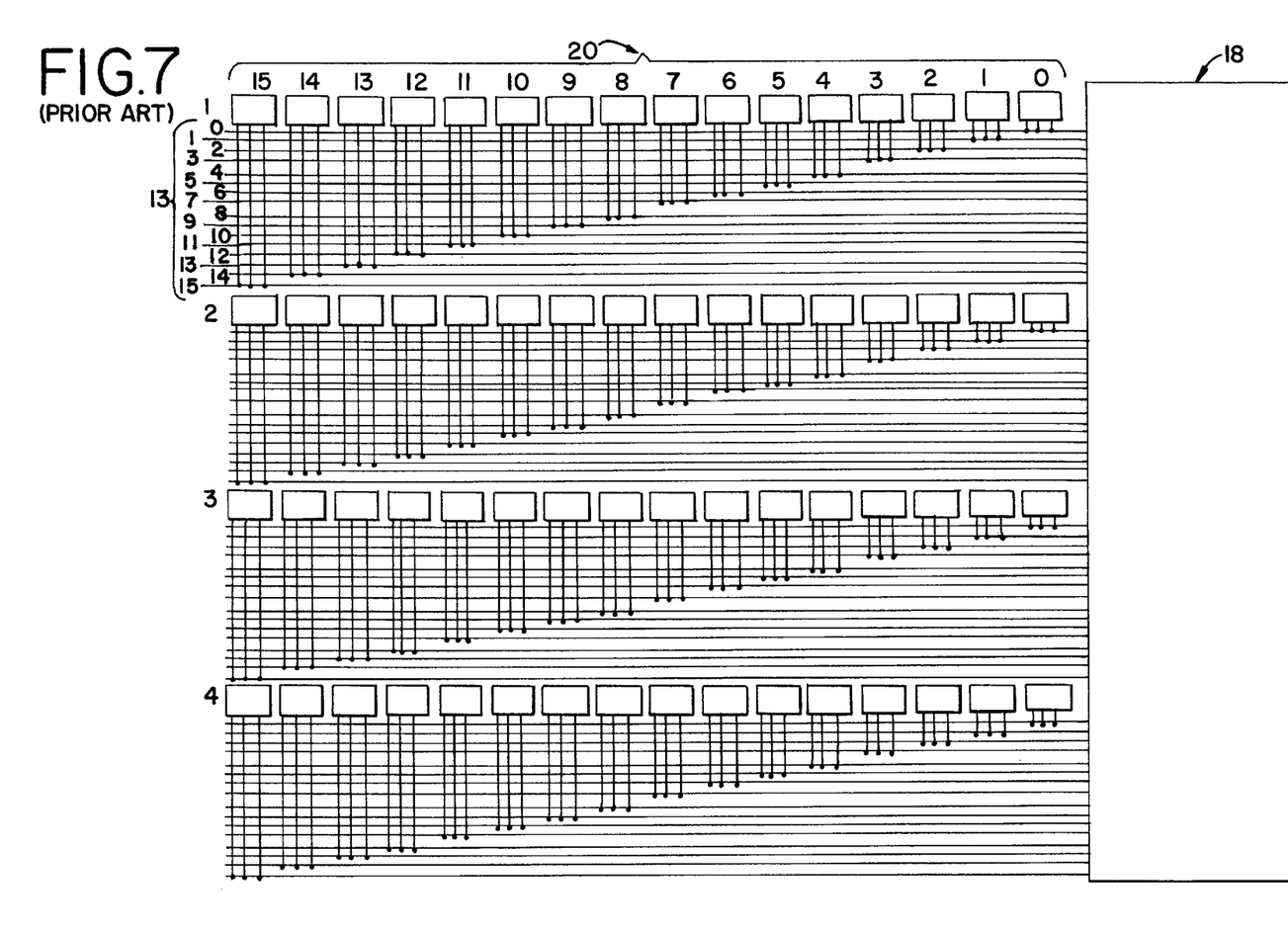
FIG. 7 is a diagram of prior art decoding circuits, showing a system for one side decoding.

Turning now to FIG. 7, a prior art X-decoder arrangement is shown for decoding from a single side of the memory array 18. In this system the three transistors 30, 32, 34 from the xd__3tr circuit 20 are grouped together so that the circuit labeled 0 represents one xd__3tr circuit 20. Thus, the three transistors 30, 32, 34 from the xd__3tr circuit 20 labeled 0 are connected to the routing line 13 for the word line 12 labeled 0 and so forth. One disadvantage of decoding from a single side with this arrangement is the wide area required for the xd__3tr circuits 20 and the routing lines 13. In this example, a memory array 18 with 64 word lines 12 is provided. Accordingly, all 64 routing lines 13 extend from the same side of the memory array 18 to connect to the corresponding 64 xd__3tr circuits 20. However, the vertical space required for all 64 routing lines 13 limits the space available for the xd__3tr circuits 20. Therefore, 4 rows of xd__3tr circuits 20 are used, with each row having 16 xd__3tr circuits 20. Correspondingly, 16 routing lines 13 are grouped below each row of xd__3tr circuits 20 for connecting the xd__3tr circuits 20 to the word lines 12 of the memory array 18.

Figure 8:
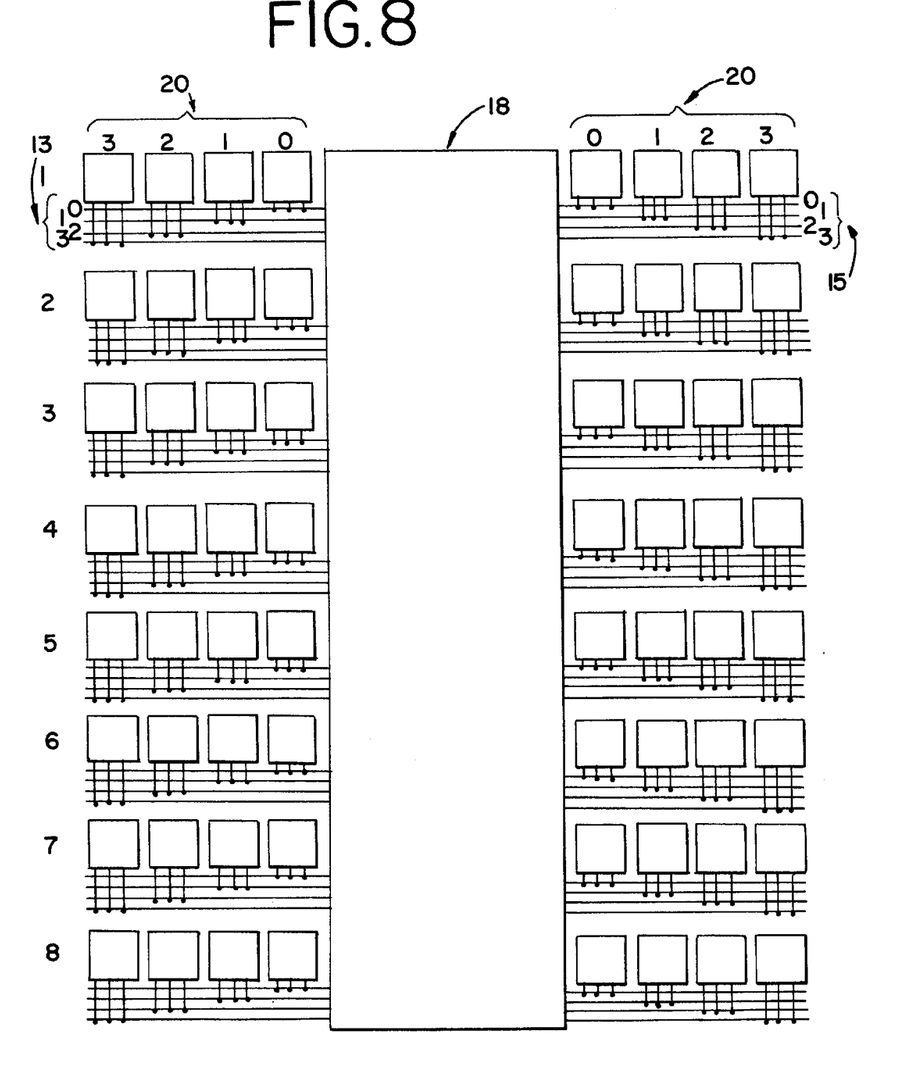
FIG. 8 is a diagram of decoding circuits, showing a system for two side decoding.

Turning now to FIG. 8, an X-decoder 10 is shown for decoding from two sides of the memory array 18. Like the system in FIG. 7, the transistors 30, 32, 34 of the xd__3tr circuits 20 are grouped together so that the three transistors 30, 32, 34 from the xd__3tr circuit 20 labeled 0 are all connected to the routing line 13,15 for the word line 12,14 labeled 0 and so forth. Also like FIG. 7, this system includes 64 word lines 12,14, routing lines 13,15, and 64 xd__3tr circuits 20. However, 32 of the xd__3tr circuits 20 are positioned on the left side of the memory array 18, and the remaining 32 xd__3tr circuits 20 are positioned on the right side. Correspondingly, 32 routing lines 13 for every other word line 12 in the memory array 18 extend from the left side of the memory array 18, with the other 32 routing lines 15 extending from the right side. Accordingly, this arrangement requires less vertical space for the routing lines 13,15 than is required for the single side decoding system, because only 32 routing lines 13,15 are used on each side instead of 64 routing lines. Because less vertical space is required for the routing lines 13,15, more rows of xd__3tr circuits 20 can be provided. Thus, in one example of decoding from two sides of the memory array 18, 8 rows of xd__3tr circuits 20 are used, with each row having 4 xd__3tr circuits 20 on each side of the memory array 18. The overall width of the X-decoder 10, therefore, is narrower than the X-decoder 10 of FIG. 7 because the number of the xd__3tr circuits 20 per row is reduced from 16 to 8.

Figure 9:
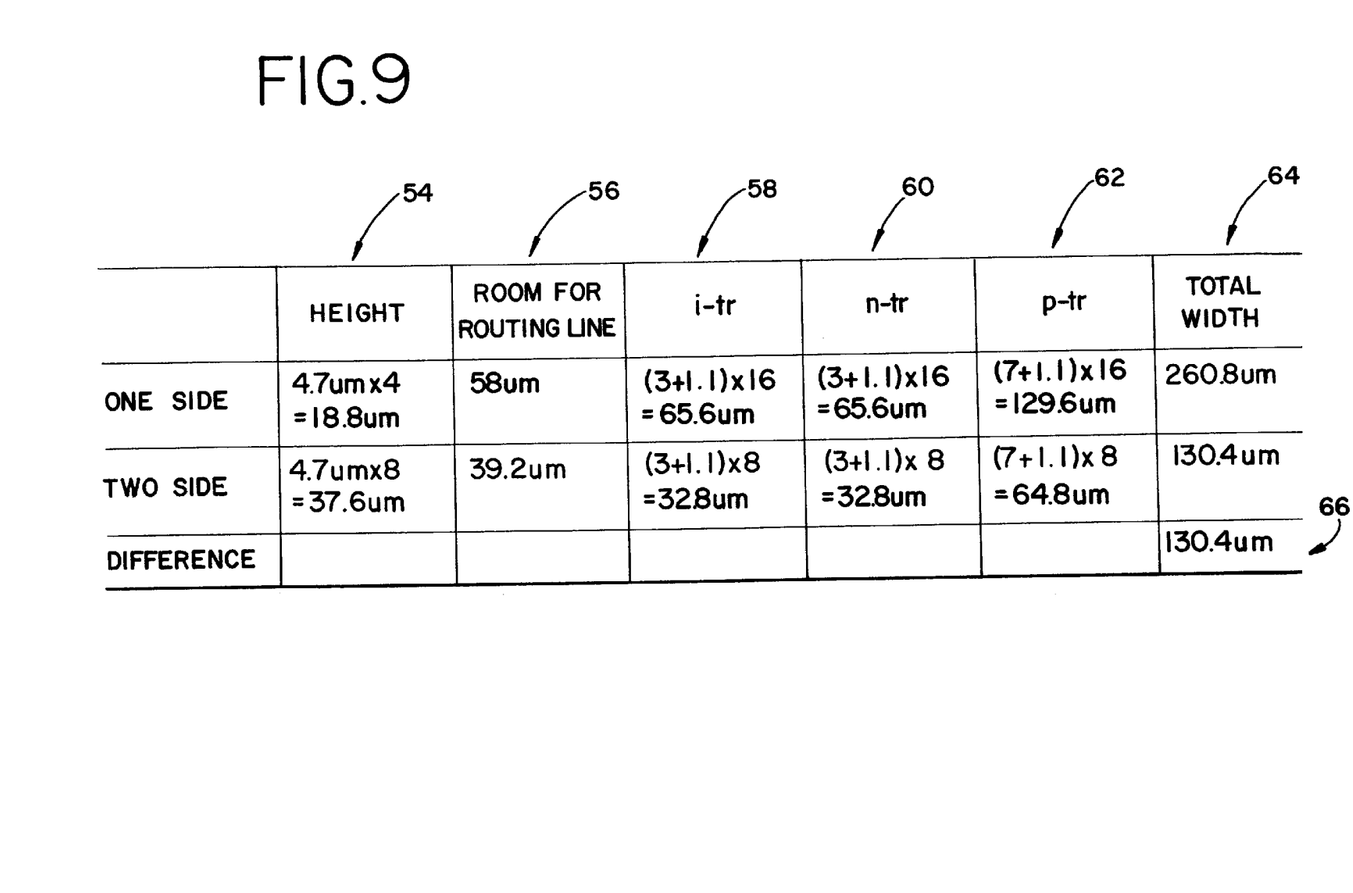
FIG. 9 is a table, showing a reduction in width of the decoding circuits for two side decoding compared to one side decoding.

Turning now to FIG. 9, the narrower width of the X-decoder 10 is quantified and compared to an X-decoder 10 for decoding from a single side of the memory array 18. In this comparison, the overall vertical space, or height 54, used by the xd__3tr circuits 20 is 18.8 $\mu$m for one side decoding and is 37.6 $\mu$m for two side decoding. This increase for two side decoding is due to the increased number of rows of xd__3tr circuits 20. The increase in vertical space 54 resulting from the rows of xd__3tr circuits 20, however, is offset by the reduced vertical space 56 needed for the routing lines 13,15, since only half as many routing lines 13,15 are used for each side.

The overall width 64 of the X-decoder 10 is significantly reduced with two side decoding compared to one side decoding. Accordingly, the width 58 of the i-transistors 34 is reduced from 65.6 $\mu$m to 32.8 $\mu$m, the width 60 of the n-channel transistors 30 is reduced from 65.6 $\mu$m to 32.8 $\mu$m, and the width 62 of the p-channel transistors 32 is reduced from 129.6 $\mu$m to 64.8 $\mu$m. Using the i-transistors 58, 34 for one side decoding as an example, the calculations shown in FIG. 9 are determined by adding the width of each individual transistor, e.g., 3, to the separation space between each of the transistors, e.g., 1.1. This width, which is required for each single transistor, is next multiplied by the number of transistors used in each row of xd__3tr circuits 20, e.g., 16. The total width 64 required for the rows of xd__3tr circuits 20 is then determined by adding the overall widths 58, 60, 62 of the i-transistors 34, n-channel transistors 30, and p-channel transistors 32. From the resulting totals 64, it is apparent from a comparison that the two side decoding system provides a significant reduction in width of the X-decoder 10. Accordingly, the total width 64 of the xd__3tr transistors 30, 32, 34 is reduced from 260.8 $\mu$m to 130.4 $\mu$m, or in other words a 50% reduction 66.

While a preferred embodiment of the invention has been described, it should be understood that the invention is not so limited, and modifications may be made without departing from the invention. The scope of the invention is defined by the appended claims, and all devices that come within the meaning of the claims, either literally or by equivalence, are intended to be embraced therein.

We claim:

1. A memory device comprising a memory array having circuit lines extending across said memory array; routing lines connected to said circuit lines extending from said memory array, wherein at least one of said routing lines extends from a first side of said memory array and at least one of said routing lines extends from a second side of said memory array; and decoding circuits connected to said routing lines; wherein said decoding circuits comprise a plurality of first decoding circuits, each of said plurality of first decoding circuits being individually connected to each of said routing lines, said decoding circuits also comprising second decoding circuits connected to said first decoding circuits, a plurality of said second decoding circuits being positioned on said first side of said memory array and being connected to said first decoding circuits positioned on said first side, a comparable plurality of said second decoding circuits being positioned on said second side of said memory array and being connected to said first decoding circuits positioned on said second side.

2. The memory device according to claim 1, wherein about half of said circuit lines are connected to said routing lines extending from said first side of said memory array and a remaining half of said circuit lines are connected to said routing lines extending from said second side.

3. The memory device according to claim 2, wherein said circuit lines are alternately connected to said routing lines extending from said first side and said second side of said memory array.

4. The memory device according to claim 1, wherein said plurality of first decoding circuits connected to said routing lines extending from said first side of said memory array are positioned on said first side and said plurality of first decoding circuits connected to said routing lines extending from said second side of said memory array are positioned on said second side.

5. The memory device according to claim 4, wherein each of said plurality of first decoding circuits comprises three transistors connected to one of said routing lines, said three transistors each being connected to the same routing line.

6. The memory device according to claim 5, wherein said plurality of first decoding circuits are xd__3tr circuits.

7. The memory device according to claim 1, wherein said plurality and comparable plurality of said second decoding circuits comprises a xd__hwl circuit, a xd__vwl circuit and a voltage power supply.

8. The memory device according to claim 1, wherein said plurality of first decoding circuits are arranged in rows of first decoding circuits and said routing lines are arranged in groups of routing lines, at least one of said rows of first decoding circuits being positioned between adjacent routing lines and at least one of said groups of said routing lines being positioned between adjacent rows of said first decoding circuits.

9. The memory device according to claim 8, wherein about half of said circuit lines are connected to said routing lines extending from said first side of said memory array and a remaining half of said circuit lines are connected to said routing lines extending from said second side, said circuit lines being alternately connected to said routing lines extending from said first side and said second side.

10. The memory device according to claim 9, wherein said arrangement of said rows of first decoding circuits and said groups of routing lines is comparable on said first side and said second side of said memory array.

11. The memory device according to claim 10, wherein said decoding circuits comprise second decoding circuits connected to said first decoding circuits, a plurality of said second decoding circuits being positioned on said first side of said memory array and being connected to said first decoding circuits positioned on said first side, a comparable plurality of said second decoding circuits being positioned on said second side of said memory array and being connected to said first decoding circuits positioned on said second side.

12. The memory device according to claim 11, wherein said memory array comprises flash memory cells.

13. The memory device according to claim 11, wherein each of said plurality of first decoding circuits comprises three transistors connected to one of said routing lines, said three transistors each being connected to the same routing line.

14. The memory device according to claim 11, wherein at least one of said rows of first decoding circuits consists of four first decoding circuits.

15. The memory device according to claim 14, wherein said plurality of first decoding circuits are xd_3tr circuits and said plurality and comparable plurality of said second decoding circuits comprises a xd_hwl circuit, a xd_vwl circuit and a voltage power supply.

16. The memory device according to claim 15, wherein said memory array comprises flash memory cells.

* * * * *